United States Patent
Choi et al.

(10) Patent No.: US 10,388,912 B2
(45) Date of Patent: Aug. 20, 2019

(54) ELECTROLUMINESCENCE DISPLAY APPARATUS

(71) Applicant: LG Display Co., Ltd., Seoul (KR)

(72) Inventors: Jeongmook Choi, Paju-si (KR); Nackyoun Jung, Paju-si (KR); Sangbin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/216,468

(22) Filed: Dec. 11, 2018

(65) Prior Publication Data

US 2019/0198811 A1 Jun. 27, 2019

(30) Foreign Application Priority Data

Dec. 22, 2017 (KR) ........................ 10-2017-0177719

(51) Int. Cl.
*H01L 51/52* (2006.01)
*H01L 51/50* (2006.01)
*H01L 27/32* (2006.01)

(52) U.S. Cl.
CPC ...... *H01L 51/5256* (2013.01); *H01L 27/3246* (2013.01); *H01L 51/5012* (2013.01); *H01L 51/5206* (2013.01); *H01L 51/5221* (2013.01)

(58) Field of Classification Search
CPC ............. H01L 51/5256; H01L 51/5012; H01L 51/5206; H01L 27/3246
See application file for complete search history.

(56) References Cited

U.S. PATENT DOCUMENTS

2013/0076231 A1* 3/2013 Nakanishi ............. G02F 1/1345
313/500
2018/0374909 A1* 12/2018 Nishikiori ........... H01L 27/3223

FOREIGN PATENT DOCUMENTS

KR 10-1773188 B1 8/2017

* cited by examiner

*Primary Examiner* — Joseph L Williams
(74) *Attorney, Agent, or Firm* — Seed IP Law Group LLP

(57) ABSTRACT

Disclosed is an electroluminescence display apparatus for protecting a light emitting layer and a thin film transistor from hydrogen and moisture. The electroluminescence display apparatus includes a substrate including an active area displaying an image and a dummy area adjacent to the active area, a bank disposed on the substrate to form an emission area in the active area and form a dummy emission area in the dummy area, a light emitting layer and a dummy light emitting layer respectively disposed in the emission area and the dummy emission area, and a sacrificial layer disposed under the dummy light emitting layer in the dummy emission area. Since the sacrificial layer including a material which is large in reactivity with hydrogen and moisture is disposed in the dummy emission area, hydrogen and moisture may be blocked or removed so as not to affect the light emitting layer and a thin film transistor.

20 Claims, 4 Drawing Sheets

ELECTROLUMINESCENCE DISPLAY APPARATUS

CROSS-REFERENCE TO RELATED APPLICATIONS

This application claims the benefit of the Korean Patent Application No. 10-2017-0177719 filed on Dec. 22, 2017, which is hereby incorporated by reference as if fully set forth herein.

BACKGROUND

Technical Field

The present disclosure relates to an electroluminescence display apparatus, and more particularly, to an electroluminescence display apparatus for protecting a light emitting layer and a thin film transistor from hydrogen and moisture.

Description of the Related Art

Electroluminescence display apparatuses are apparatuses where a light emitting layer is provided between two electrodes and emits light with an electric field between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

Hereinafter, a related art electroluminescence display apparatus will be described with reference to the drawing.

Figure 1:
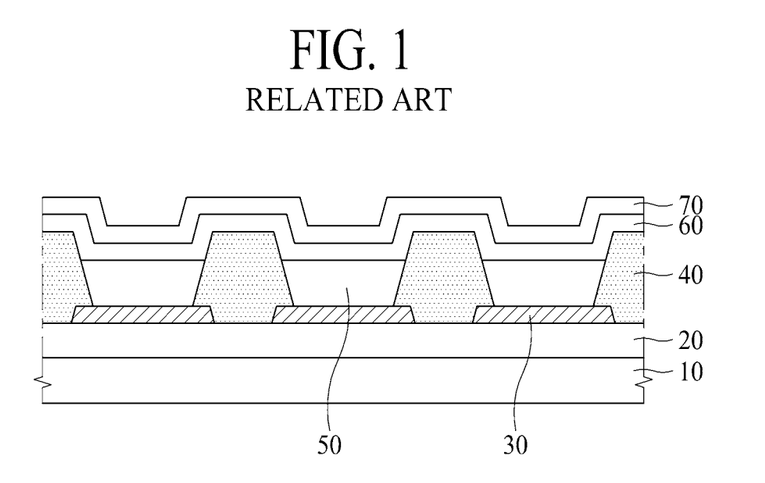
FIG. 1 is a schematic cross-sectional view of a related art electroluminescence display apparatus.

FIG. 1 is a schematic cross-sectional view of a related art electroluminescence display apparatus.

As seen in FIG. 1, the related art electroluminescence display apparatus includes a substrate 10, a circuit element layer 20, a first electrode 30, a bank 40, a light emitting layer 50, a second electrode 60, and an encapsulation layer 70.

The circuit element layer 20 is provided on the substrate 10. Various signal lines, a thin film transistor (TFT), a capacitor, and a planarization layer are provided in the circuit element layer 20.

The first electrode 30 is provided on the circuit element layer 20. The first electrode 30 is patterned in each of a plurality of pixels and acts as an anode of the related art electroluminescence display apparatus.

The bank 40 is provided in a matrix structure to form an emission area.

The light emitting layer 50 is provided in the emission area formed by the bank 40.

The second electrode 60 is provided on the light emitting layer 50. The second electrode 60 is provided as a common layer of a plurality of pixels and acts as a cathode of the related art electroluminescence display apparatus.

The encapsulation layer 70 is provided on the second electrode 60. The encapsulation layer 70 protects the light emitting layer 50 and the TFT, which are vulnerable to moisture.

In the related art electroluminescence display apparatus, hydrogen occurring in a process of forming the encapsulation layer 70 affects the light emitting layer 50 and the TFT, causing a hot spot.

Moreover, in the related art electroluminescence display apparatus, when an outgassing phenomenon where a gas is leaked from the planarization layer occurs, the light emitting layer 50 vulnerable to moisture is degraded, causing the degradation in image quality.

BRIEF SUMMARY

Accordingly, the present disclosure is directed to providing an electroluminescence display apparatus that substantially obviates one or more problems due to limitations and disadvantages of the related art.

One aspect of the present disclosure is directed to providing an electroluminescence display apparatus for protecting a light emitting layer and a thin film transistor from hydrogen and moisture.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

Another aspect of the present disclosure is directed to providing a display apparatus having an improved image quality.

Another aspect of the present disclosure is directed to providing a display apparatus that prevents the occurrence of hot spots in the display due to including a sacrificial layer having high reactivity to hydrogen and moisture in the dummy area.

Another aspect of the present disclosure is directed to providing a display apparatus that absorbs and can remove hydrogen and moisture in the areas that contain the transistor and the light emitting layer.

To achieve these and other advantages and in accordance with the purpose of the disclosure, as embodied and broadly described herein, there is provided an electroluminescence display apparatus including a substrate, a bank disposed on a substrate to form an emission area in the active area and form a dummy emission area in the dummy area, a light emitting layer and a dummy light emitting layer respectively disposed in the emission area and the dummy emission area, and a sacrificial layer disposed under the dummy light emitting layer in the dummy emission area.

In another aspect of the present disclosure, there is provided an electroluminescence display apparatus including a substrate including an active area where a light emitting layer emitting light is disposed and dummy area where a dummy light emitting layer which does not emit light is disposed, and a sacrificial layer including a material which is larger in reactivity with hydrogen or moisture than the dummy light emitting layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of an electroluminescence display apparatus according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Hereinafter, exemplary embodiments of the present disclosure will be described in detail with reference to the accompanying drawings.

Figure 2:
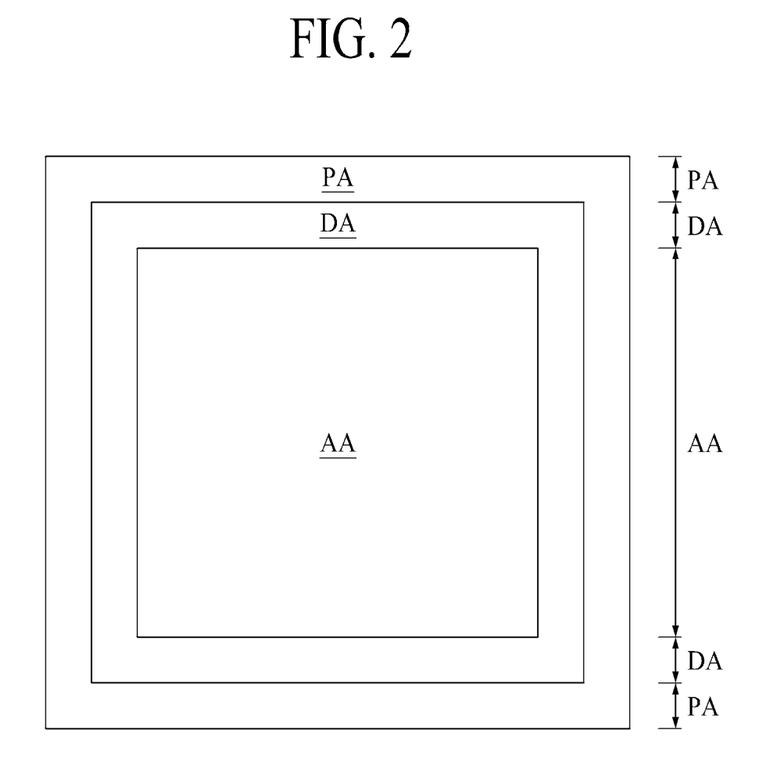
FIG. 2 is a schematic plan view of an electroluminescence display apparatus according to an embodiment of the present disclosure.

FIG. 2 is a schematic plan view of an electroluminescence display apparatus according to an embodiment of the present disclosure.

As seen in FIG. 2, the electroluminescence display apparatus according to an embodiment of the present disclosure may include an active area AA, a dummy area DA, and a pad area PA.

The active area AA may function as a display area which displays an image. A plurality of pixels may be provided in the active area AA, and an emission area may be provided in each of the plurality of pixels.

In detail, signal lines such as a gate line, a data line, a power line, and a reference line may be provided in each of the plurality of pixels provided in the active area AA. Also, a plurality of thin film transistors (TFTs) for switching the transfer of signals applied through the signal lines may be provided in each pixel provided in the active area AA, and a light emitting device which is driven by the plurality of TFTs to emit light may be provided in each pixel.

The dummy area DA may be disposed to be adjacent to the active area AA. In one embodiment, the dummy area DA may be positioned to surround the active area AA.

In detail, the dummy area DA may be disposed outside of the upper, lower, left, and right sides of the active area AA. A plurality of dummy pixels may be provided in the dummy area DA, and a dummy emission area may be provided in each of the plurality of dummy pixels. Since the dummy area DA is not the display area which displays an image, the dummy pixels provided in the dummy area DA may have a structure which differs from that of each pixel provided in the active area AA. For example, at least one of a signal line, a TFT, and a light emitting device may not be provided or may be inoperably provided in each of the dummy pixels provided in the dummy area DA, and thus, light may not be emitted from each dummy pixel provided in the dummy area DA. If light is emitted in the dummy area DA, the image quality of the electroluminescence display apparatus is degraded due to light leakage occurring in the dummy area DA.

The dummy area DA prevents a process error from occurring between a center and an outer portion of the active area AA. This will be described below in detail.

A plurality of stacking processes and a plurality of mask processes may be performed for forming the plurality of pixels in the active area AA. Each of the stacking processes may be a process of forming an insulation layer, a metal layer, or an organic layer through a physical deposition process, a chemical deposition process, a coating process, or an inkjet process, and each of the mask processes may be a process of patterning the insulation layer, the metal layer, or the organic layer formed through the stacking processes to have a certain shape by using a photolithography process known to those skilled in the art.

As described above, when the plurality of stacking processes and the plurality of mask processes are performed on the active area AA, there is a possibility that a process error occurs between the center and an edge of the active area AA due to process characteristic. For this reason, the dummy area DA may be provided in the edge of the active area AA, and thus, in a case where an error occurs, the error occurs in the dummy area DA without occurring in the active area AA.

Particularly, when a light emitting layer of the light emitting device is formed through an inkjet process, a difference in drying the light emitting layer may occur between a center and an edge of a substrate, and in this case, if the dummy area DA is not provided, light emission between the center and the edge of the active area AA is not uniform thickness-wise.

Therefore, the dummy area DA may be provided outside the active area AA, and thus, in a case where the light emitting layer of the light emitting device is formed through the inkjet process, drying of the light emitting layer is not uniform between the active area AA and the dummy area DA, but drying of the light emitting layer is wholly uniform in the active area AA.

The pad area PA may be disposed outside the dummy area DA.

A circuit driver such as a gate driver or a data driver may be provided in the pad area PA. The circuit driver may be disposed outside of at least one of upper, lower, left, and right sides of the dummy area DA. The circuit driver provided in the pad area PA may be connected to the circuit element disposed in the active area AA via the dummy area DA.

Figure 3:
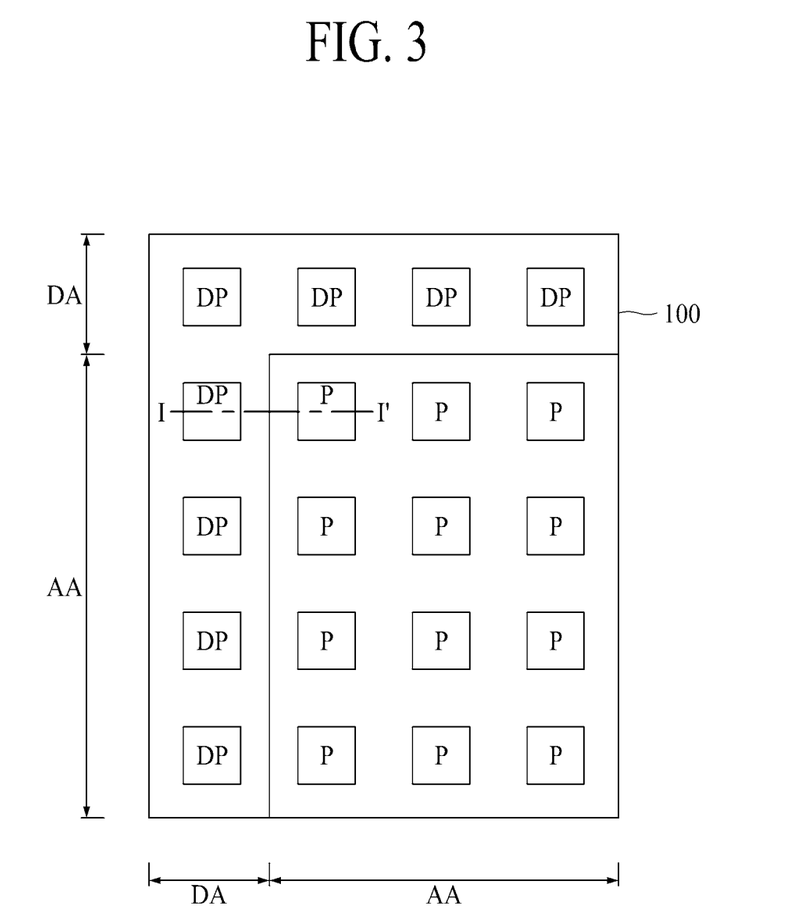
FIG. 3 is a schematic plan view illustrating an active area and a dummy area of an electroluminescence display apparatus according to an embodiment of the present disclosure.

FIG. 3 is a schematic plan view illustrating an active area and a dummy area of an electroluminescence display apparatus according to an embodiment of the present disclosure.

As seen in FIG. 3, an active area AA may be provided on a substrate 100, and a dummy area DA may be provided outside the active area AA. FIG. 3 schematically illustrates a left upper area of the substrate 100.

A plurality of pixels P may be provided in the active area AA. The plurality of pixels P may emit red light, green light, and blue light, but are not limited thereto.

A plurality of dummy pixels DP may be provided in the dummy area DA.

The plurality of pixels P and the plurality of dummy pixels DP may be arranged in a matrix type as illustrated, but the present disclosure is not limited thereto. For example, an arrangement structure of the pixels P and the dummy pixels DP may be changed to various types known to those skilled in the art. For example, some of the plurality of dummy pixels DP may be arranged in a column which differs from a column in which pixels P are arranged. Also, some of the plurality of dummy pixels DP may be arranged in the same column as a column in which pixels P are arranged.

Figure 4:
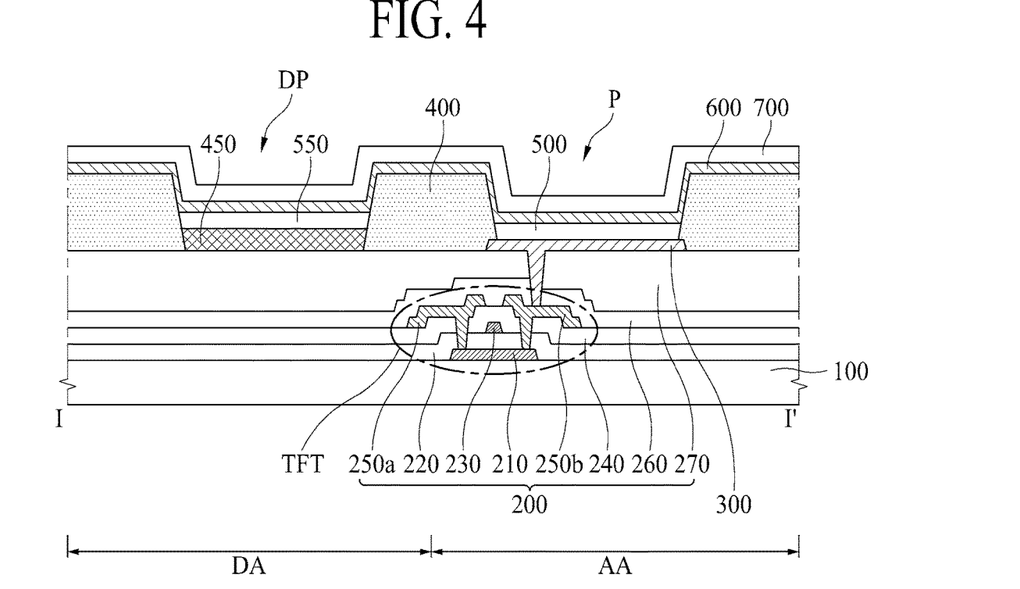
FIG. 4 is a cross-sectional view of an electroluminescence display apparatus according to a first embodiment of the present disclosure and is a cross-sectional view taken along line I-I' of FIG. 3.

FIG. 4 is a cross-sectional view of an electroluminescence display apparatus according to a first embodiment of the present disclosure and is a cross-sectional view taken along line I-I' of FIG. 3.

As seen in FIG. 4, the electroluminescence display apparatus according to the first embodiment of the present disclosure may include an active area AA and a dummy area DA, which are provided on a substrate 100.

The substrate 100 may be formed of glass, plastic, and/or the like, but is not limited thereto. The substrate 100 may be formed of a transparent material, or may be formed of an opaque material.

The electroluminescence display apparatus according to the first embodiment of the present disclosure may be implemented as a top emission type where emitted light travels to an upper portion, and in this case, a material of the substrate 100 may use an opaque material as well as a transparent material. Also, the electroluminescence display apparatus according to the first embodiment of the present disclosure may be implemented as a bottom emission type where emitted light travels to a lower portion, and in this case, the material of the substrate 100 may use a transparent material.

A circuit element layer 200, a first electrode 300, a bank 400, a light emitting layer 500, a second electrode 600, and an encapsulation layer 700 may be provided in the active area AA on the substrate 100.

The circuit element layer 200 may be provided on the substrate 100. The circuit element layer 200 may include an active layer 210, a gate insulation layer 220, a gate electrode 230, an interlayer insulation layer 240, a source electrode 250a, a drain electrode 250b, a passivation layer 260, and a planarization layer 270.

The active layer 210 may be provided on the substrate 100. The active layer 210 may be formed of a silicon-based semiconductor material, an oxide semiconductor material, and/or the like, but is not limited thereto. Also, although not shown, a light blocking layer may be additionally provided between the substrate 100 and the active layer 210 and may block the traveling of light to the active layer 210, thereby preventing the active layer 210 from being degraded.

The gate insulation layer 220 may be provided on the active layer 210 and may insulate the active layer 210 from the gate electrode 230.

The gate electrode 230 may be provided on the gate insulation layer 220.

The interlayer insulation layer 240 may be provided on the gate electrode 230 and may insulate the gate electrode 230 from the source and drain electrodes 250a and 250b.

The source electrode 250a and the drain electrode 250b may face each other and may be spaced apart from each other on the interlayer insulation layer 240. The source electrode 250a may be connected to one end of the active layer 210 through a contact hole which is provided in the interlayer insulation layer 240 and the gate insulation layer 220, and the drain electrode 250b may be connected to the other end of the active layer 210 through another contact hole which is provided in the interlayer insulation layer 240 and the gate insulation layer 220.

The passivation layer 260 may be provided on the source electrode 250a and the drain electrode 250b and may protect a thin film transistor (TFT).

The planarization layer 270 may be provided on the passivation layer 260 and may planarize a surface on the substrate 100.

As described above, the circuit element layer 200 may include a TFT which includes the active layer 210, the gate electrode 230, the source electrode 250a, and the drain electrode 250b. In FIG. 4, a TFT having a top gate structure where the gate electrode 230 is provided on the active layer 210 is illustrated, but is not limited thereto. In other embodiments, the circuit element layer 200 may include a TFT having a bottom gate structure where the gate electrode 230 is provided under the active layer 210.

In the circuit element layer 200, a circuit element including various signal lines, TFTs, and a capacitor may be provided in each of a plurality of pixels. The signal lines may include a gate line, a data line, a power line, and a reference line, and the TFTs may include a switching TFT, a driving TFT, and a sensing TFT. The TFT illustrated in FIG. 4 may correspond to the driving TFT.

The switching TFT may be turned on by a gate signal supplied through the gate line and may transfer a data voltage, supplied through the data line, to the driving TFT.

The driving TFT may be turned on by the data voltage transferred from the switching TFT to generate a data current from a power supplied through the power line and may supply the data current to the first electrode 300.

The sensing TFT may sense a threshold voltage deviation of the driving TFT which causes the degradation in image quality. The sensing TFT may supply a current of the driving TFT to the reference line in response to a sensing control signal supplied through the gate line or a separate sensing line.

The capacitor may hold the data voltage supplied to the driving TFT during one frame and may be connected to a gate electrode and a source electrode of the driving TFT.

In a case where the electroluminescence display apparatus according to the first embodiment of the present disclosure is implemented as the top emission type, light emission is not affected by the TFT even when the TFT is disposed under the light emitting layer 500, and thus, the TFT may be disposed under the light emitting layer 500.

The first electrode 300 may be provided on the circuit element layer 200. The first electrode 300 may be patterned in each of the plurality of pixels and may act as an anode of the electroluminescence display apparatus.

When the electroluminescence display apparatus according to the first embodiment of the present disclosure is implemented as the top emission type, the first electrode 310 may include a reflective material for reflecting light, emitted from the light emitting layer 500, to an upper portion. In this case, the first electrode 310 may have a stacked structure including a transparent conductive material and the reflective material. On the other hand, when the electroluminescence display apparatus according to the first embodiment of the present disclosure is implemented as the bottom emission type, the first electrode 310 may be formed of the transparent conductive material.

The first electrode 300 may be connected to the drain electrode 250*b* of the TFT through a contact hole which is provided in the planarization layer 270 and the passivation layer 260. The first electrode 300 may be connected to the source electrode 250*a* of the TFT through a contact hole which is provided in the planarization layer 270 and the passivation layer 260.

The bank 400 may be provided between adjacent pixels of the plurality of pixels P. The bank 400 may be wholly provided in a matrix structure and may form an emission area in an individual pixel P. The bank 400 may be provided on the planarization layer 270 to hide both ends of the first electrode 300. Therefore, a plurality of first electrodes 300 patterned in the plurality of pixels P may be insulated from one another by the bank 400.

The light emitting layer 500 may be provided on the first electrode 300. The light emitting layer 500 may be provided in an emission area adjacent to the bank 400. The light emitting layer 500 may be provided to emit lights of different colors for each of the plurality of pixels P. For example, the light emitting layer 500 may be provided to emit red light, green light, and blue light, but is not limited thereto. The light emitting layer 500 may be provided to emit white light, and in this case, a color filter may be further provided in a traveling path of light emitted from the light emitting layer 500 for each of the plurality of pixels P.

The light emitting layer 500 may be patterned in each of the plurality of pixels P through an evaporation process using a mask, or may be patterned in each of the plurality of pixels P through a solution process using an inkjet apparatus without a mask. Depending on the case, the light emitting layer 500 may be wholly provided in a plurality of pixels P area and a boundary area therebetween, and in this case, the light emitting layer 500 may be provided to emit white light.

That is, the light emitting layer 500 may also be provided on an upper surface of the bank 400 corresponding to a boundary area between the plurality of pixels P.

The light emitting layer 500 may include at least one organic layer of a hole injecting layer, a hole transporting layer, an organic light emitting layer, an electron transporting layer, and an electron injecting layer.

The second electrode 600 may be provided on the light emitting layer 500 and may function as a cathode of the electroluminescence display apparatus. The second electrode 600 may be provided on the bank 400 as well as the light emitting layer 500. Therefore, the second electrode 600 may function as a common electrode which receives a common voltage applied to the plurality of pixels P.

The encapsulation layer 700 may be provided on the second electrode 600. The encapsulation layer 700 may be disposed to cover the active area AA, and moreover, may be disposed to cover the dummy area DA. The encapsulation layer 700 may prevent oxygen or moisture from penetrating into the TFT, the first electrode 300, the light emitting layer 500, and the second electrode 600. To this end, the encapsulation layer 700 may include at least one inorganic layer and at least one organic layer. In one embodiment, moisture may refer to water or other kind of fluid present in the form of vapor, gas, liquid, or solid. Moisture as used herein, is broadly construed to include any composition of material that may affect the operational functions of the display elements when penetrated into the display elements of the electroluminescence display apparatus and is not necessarily limited to water. It may, for example, include alcohols, oils and other compositions of matter. Each of these compositions include hydrogen and many of them include both hydrogen and oxygen. The present disclosure is beneficial to prevent penetration into the display area of any compositions that include hydrogen and/or oxygen.

A circuit element layer 200, a bank 400, a sacrificial layer 450, a dummy light emitting layer 550, a second electrode 600, and an encapsulation layer 700 may be provided in the dummy area DA on the substrate 100.

The circuit element layer 200 provided in the dummy area DA may be formed to have the same structure through the same process as the circuit element layer 200 provided in the active area AA.

However, the present embodiment is not limited thereto. In other embodiments, some of signal lines such as a gate line, a data line, a power line, and a reference line may not be provided in the circuit element layer 200 provided in the dummy area DA, or at least one of a switching TFT and a driving TFT may not be provided in the circuit element layer 200. Therefore, light may not be emitted in the dummy area DA. Depending on the case, the circuit element layer 200 provided in the dummy area DA may be inoperably configured so that one of the switching TFT and the driving TFT does not operate.

The bank 400 provided in the dummy area DA may be provided between adjacent dummy pixels of a plurality of dummy pixels DP. The bank 400 provided in the dummy area DA may form a dummy emission area in an individual dummy pixel DP. In the drawing, only one dummy pixel DP is illustrated as being provided in the dummy area DA, but the plurality of dummy pixels DP may be provided in the dummy area DA.

Similarly to the bank 400 provided in the active area AA, the bank 400 provided in the dummy area DA may be wholly provided in a matrix structure and may form the dummy emission area in an individual dummy pixel DP. As a result, the bank 400 may be provided in the matrix structure in the active area AA and the dummy area DA.

The sacrificial layer 450 provided in the dummy area DA, according to the first embodiment of the present disclosure, may be provided on the planarization layer 270. The sacrificial layer 450 may be provided between adjacent banks 400 of a plurality of banks provided in the dummy area DA, and thus, may be disposed in a dummy emission area of the dummy area DA. When the sacrificial layer 450 is provided in an emission area of the active area AA, a roughness may increase and may affect the light emitting layer 500, and due to this, the image quality of the electroluminescence display apparatus may be degraded, accordingly the sacrificial layer 450 may not be provided in the active area AA.

In the related art electroluminescence display apparatus, when an outgassing phenomenon where a gas is leaked from the planarization layer 270 occurs, the light emitting layer 500 vulnerable to moisture may be degraded. Also, in the related art electroluminescence display apparatus, hydrogen occurring in a process of forming the encapsulation layer 700 affects the light emitting layer 500 and the TFT, causing a hot spot.

In order to solve such a problem, in the electroluminescence display apparatus according to the first embodiment of the present disclosure, the sacrificial layer 450 may be provided in the dummy emission area. The sacrificial layer 450 may be formed of a material which is large in reactivity with hydrogen and moisture, and for example, may be formed of one of magnesium (Mg), calcium (Ca), and barium (Ba) or a compound including one of Mg, Ca, and Ba. Since the sacrificial layer 450 includes a material which is larger in reactivity with hydrogen and moisture than the light emitting layer 500, hydrogen and moisture may be blocked or removed so as not to affect the light emitting layer 500 and the TFT. The sacrificial layer 450 may be disposed in the dummy area DA adjacent to the active area AA, thereby protecting TFTs disposed in an end of the active area AA. Hydrogen used herein is to refer to the chemical element $_1$H, as well as any chemical compounds that is combined with hydrogen, and is not necessarily limited to $_1$H.

The sacrificial layer 450 may be formed through a physical deposition process, a chemical deposition process, or a coating process, or may be patterned in each of a plurality of dummy pixels through a solution process using an inkjet apparatus without a mask.

The dummy light emitting layer 550 provided in the dummy area DA may be provided on the sacrificial layer 450. The dummy light emitting layer 550 disposed in the dummy area DA may be formed of the same material to have the same thickness as the light emitting layer 500 provided in the active area AA.

Since the dummy area DA is not a display area which displays an image, the dummy pixels DP provided in the dummy area DA may be configured so as not to emit light. However, when light is emitted in the dummy area DA, the display quality of the electroluminescence display apparatus is degraded due to light leakage occurring in the dummy area DA.

In order for light to be not emitted from the dummy pixels DP, a TFT may not be provided in the circuit element layer 200 disposed in the dummy area DA, or the first electrode 300 may not be provided in the dummy area DA.

The second electrode 600 provided in the dummy area DA may be formed in a structure which extends from the second electrode 600 provided in the active area AA. However, the second electrode 600 may not be provided in the dummy area DA, and thus, light may not be emitted in the dummy area DA.

The encapsulation layer 700 provided in the dummy area DA and may extend from the encapsulation layer 700 provided in the active area AA. The encapsulation layer 700 may be formed of an inorganic insulating material, or may be formed in a structure where an inorganic insulating material and an organic insulating material are alternately stacked, but is not limited thereto.

As described above, in the electroluminescence display apparatus according to the first embodiment of the present disclosure, since the sacrificial layer 450 including a material which is large in reactivity with hydrogen and moisture is disposed in the dummy emission area, hydrogen and moisture may be blocked or removed so as not to affect the light emitting layer 500 and the TFT.

Therefore, in the electroluminescence display apparatus according to the first embodiment of the present disclosure, a hot spot occurring when hydrogen and moisture affect the TFT may be prevented, thereby solving a problem where image quality is degraded when the light emitting layer vulnerable to moisture is degraded.

Figure 5:
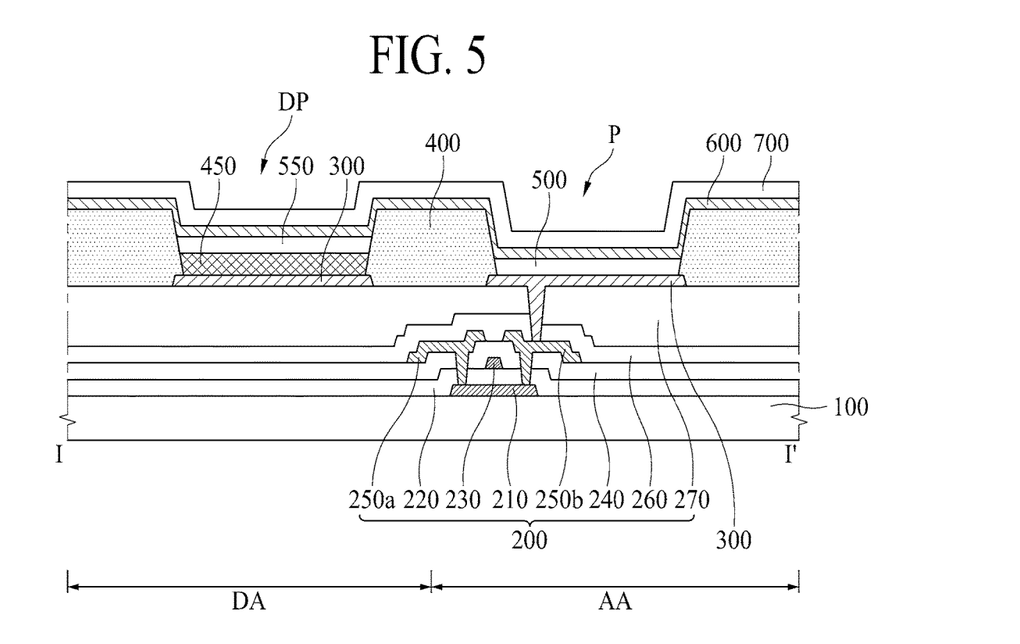
FIG. 5 is a cross-sectional view of an electroluminescence display apparatus according to a second embodiment of the present disclosure and is a cross-sectional view taken along line I-I' of FIG. 3.

FIG. 5 is a cross-sectional view of an electroluminescence display apparatus according to a second embodiment of the present disclosure and is a cross-sectional view taken along line I-I' of FIG. 3. Except for that a first electrode 300 is further provided in a dummy area DA, the electroluminescence display apparatus according to the second embodiment of the present disclosure is the same as the electroluminescence display apparatus according to the embodiment of FIG. 4. Hereinafter, therefore, like reference numerals refer to like elements, and only different elements will be described.

In the electroluminescence display apparatus according to the second embodiment of the present disclosure, a circuit element layer 200, a first electrode 300, a bank 400, a sacrificial layer 450, a dummy light emitting layer 550, a second electrode 600, and an encapsulation layer 700 may be provided in a dummy area DA on a substrate 100.

The first electrode 300 provided in the dummy area DA may be formed to have the same structure through the same process as the first electrode 300 provided in the active area AA. However, a TFT may not be provided in the dummy area DA, and thus, light may not be emitted in the dummy area DA.

The bank 400 provided in the dummy area DA may be provided on the planarization layer 270 to hide both ends of the first electrode 300. Therefore, a plurality of first electrodes 300 respectively provided in a plurality of dummy pixels DP may be insulated from one another by the bank 400.

The sacrificial layer 450 provided in the dummy area DA, according to the second embodiment of the present disclosure, may be provided on the first electrode 300. In detail, the sacrificial layer 450 may be provided in a dummy emission area and may be disposed between the first electrode 300 and the dummy light emitting layer 550. Therefore, the first electrode 300 may not be connected to the dummy light emitting layer 550 due to the sacrificial layer 450 disposed in the dummy emission area of the dummy area DA, and thus, light may not be emitted in the dummy area DA.

The sacrificial layer 450 may be formed of a material which is large in reactivity with hydrogen and moisture, and for example, may be formed of one of Mg, Ca, and Ba or a compound including one of Mg, Ca, and Ba. Since the sacrificial layer 450 includes a material which is larger in reactivity with hydrogen and moisture than the light emitting layer 500, hydrogen and moisture may be blocked or removed so as not to affect the light emitting layer 500 and the TFT. The sacrificial layer 450 may be disposed in the dummy area DA surrounding the active area AA, thereby protecting TFTs disposed in an end of the active area AA.

The sacrificial layer 450 may be formed through a physical deposition process, a chemical deposition process, or a coating process, or may be patterned in each of a plurality of dummy pixels through a solution process using an inkjet apparatus without a mask.

As described above, in the electroluminescence display apparatus according to the second embodiment of the present disclosure, since the sacrificial layer 450 including a material which is large in reactivity with hydrogen and moisture is disposed in the dummy emission area, hydrogen and moisture may be blocked or removed so as not to affect the light emitting layer 500 and the TFT.

Therefore, in the electroluminescence display apparatus according to the second embodiment of the present disclosure, a hot spot occurring when hydrogen and moisture affect the TFT may be prevented, thereby solving a problem where image quality is degraded when the light emitting layer vulnerable to moisture is degraded.

Figure 6:
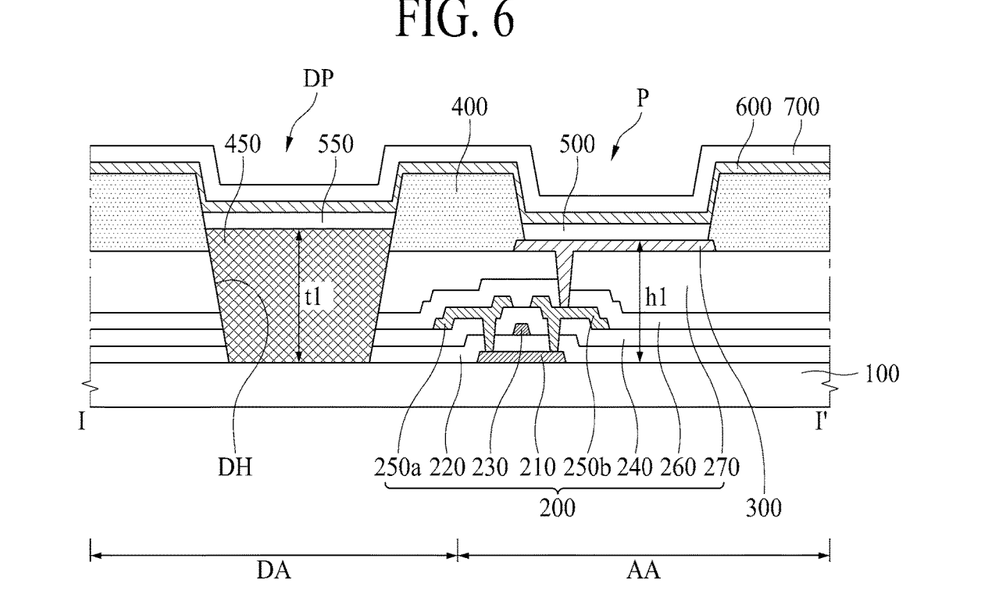
FIG. 6 is a cross-sectional view of an electroluminescence display apparatus according to a third embodiment of the present disclosure and is a cross-sectional view taken along line I-I' of FIG. 3.

FIG. 6 is a cross-sectional view of an electroluminescence display apparatus according to a third embodiment of the present disclosure and is a cross-sectional view taken along line I-I' of FIG. 3. Except for that a structure of a dummy light emitting layer 550 is modified, the electroluminescence display apparatus according to the third embodiment of the present disclosure is the same as the electroluminescence display apparatus according to the embodiment of FIG. 4. Hereinafter, therefore, like reference numerals refer to like elements, and only different elements will be described.

In the electroluminescence display apparatus according to the third embodiment of the present disclosure, a circuit element layer 200 with a dummy hole DH provided therein, a bank 400, a sacrificial layer 450, a dummy light emitting layer 550, a second electrode 600, and an encapsulation layer 700 may be provided in a dummy area DA on a substrate 100.

The circuit element layer 200 provided in the dummy area DA may not include a TFT and may include a gate insulation layer 220 disposed on the substrate 100, an interlayer insulation layer 240 disposed on the gate insulation layer 220, and a planarization layer 270 disposed on the interlayer insulation layer 240. When a passivation layer 260 is provided in an active area AA, the passivation layer 260 may be further provided on the interlayer insulation layer 240 in the dummy area DA.

By partially removing the gate insulation layer 220, the interlayer insulation layer 240, the passivation layer 260, and the planarization layer 270, the dummy hole DH may be provided in the circuit element layer 200 in a dummy emission area which is provided between a plurality of banks 400. The dummy hole DH may be provided over the substrate 100. Since the circuit element layer 200 includes the dummy hole DH without including a TFT, light may not be emitted in the dummy area DA.

The sacrificial layer 450 provided in the dummy area DA, according to the third embodiment of the present disclosure, may be disposed in the dummy hole DH of the circuit element layer 200. The sacrificial layer 450 may be disposed in the dummy hole DH on the substrate 100 to have a thickness which is thicker than that of the circuit element layer 200, thereby absorbing and removing a large amount of hydrogen and moisture. Particularly, since the sacrificial layer 450 is disposed in the dummy hole DH of the circuit element layer 200, the sacrificial layer 450 may be disposed closer to a TFT provided in the active area AA and may effectively remove moisture and hydrogen capable of penetrating into the TFT.

The sacrificial layer 450 may be provided up to a height (h1) of the first electrode 300 from the substrate 100 provided in the active area AA, but is not limited thereto. For example, the height (h1) may refer to the distance between the substrate 100 and the first electrode 300 provided in the active area AA. In another embodiment, the height (h1) may refer to the distance between the top surface of the substrate 100 and the top surface of the first electrode 300 provided in the active area AA. In another embodiment, the height (h1) may refer to the distance between the bottom surface of the substrate 100 and the top surface of the first electrode 300 provided in the active area AA. In other embodiments, the sacrificial layer 450 may be provided to have a thickness (t1) larger than the height (h1) of the first electrode 300 from the substrate 100. When the sacrificial layer 450 is provided up to a height (h1) of the first electrode 300 provided in the active area AA, a height of the dummy light emitting layer 550 disposed on the sacrificial layer 450 may be the same as that of the light emitting layer 500 disposed in the active area AA.

The sacrificial layer 450 may be formed of a material which is large in reactivity with hydrogen and moisture, and for example, may be formed of one of Mg, Ca, and Ba or a compound including one of Mg, Ca, and Ba. Since the sacrificial layer 450 includes a material which is larger in reactivity with hydrogen and moisture than the light emitting layer 500, hydrogen and moisture may be blocked or removed so as not to affect the light emitting layer 500 and the TFT. The sacrificial layer 450 may be disposed in the dummy area DA surrounding the active area AA, thereby protecting TFTs disposed in an end of the active area AA.

The sacrificial layer 450 may be formed through a physical deposition process, a chemical deposition process, or a coating process, or may be patterned in each of a plurality of dummy pixels through a solution process using an inkjet apparatus without a mask.

As described above, in the electroluminescence display apparatus according to the third embodiment of the present disclosure, since the sacrificial layer 450 including a material which is large in reactivity with hydrogen and moisture is disposed in the dummy emission area, hydrogen and moisture may be blocked or removed so as not to affect the light emitting layer 500 and the TFT.

Therefore, in the electroluminescence display apparatus according to the third embodiment of the present disclosure, a hot spot occurring when hydrogen and moisture affect the TFT may be prevented, thereby solving a problem where image quality is degraded when the light emitting layer vulnerable to moisture is degraded.

Figure 7:
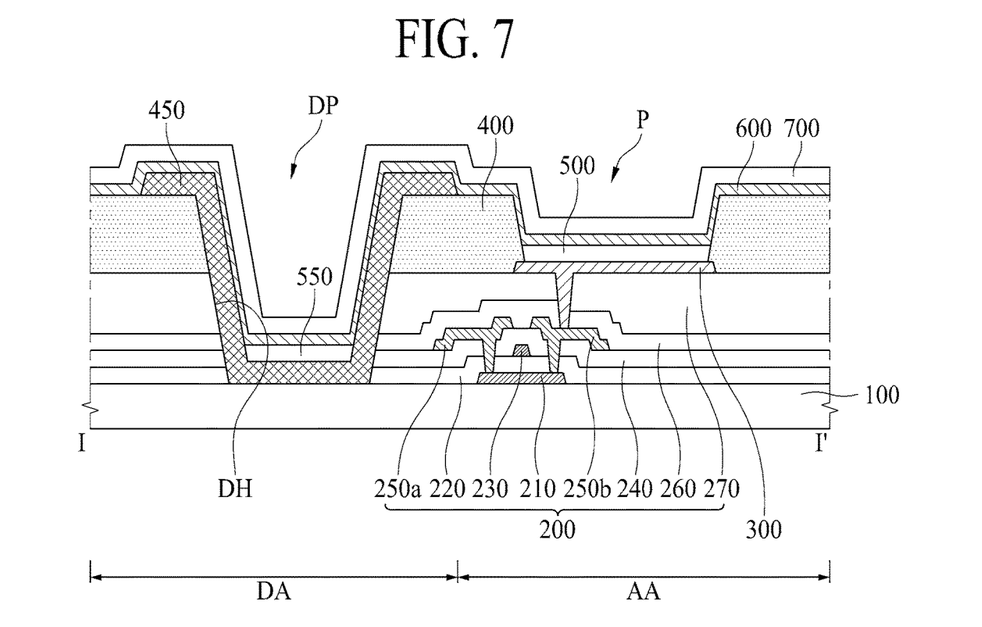
FIG. 7 is a cross-sectional view of an electroluminescence display apparatus according to a fourth embodiment of the present disclosure and is a cross-sectional view taken along line I-I' of FIG. 3.

FIG. 7 is a cross-sectional view of an electroluminescence display apparatus according to a fourth embodiment of the present disclosure and is a cross-sectional view taken along line I-I' of FIG. 3. Except for that a structure of a dummy light emitting layer 550 is modified, the electroluminescence display apparatus according to the fourth embodiment of the present disclosure is the same as the electroluminescence display apparatus according to the embodiment of FIG. 4. Hereinafter, therefore, like reference numerals refer to like elements, and only different elements will be described.

In the electroluminescence display apparatus according to the fourth embodiment of the present disclosure, a circuit element layer 200 with a dummy hole DH provided therein, a bank 400, a sacrificial layer 450, a dummy light emitting layer 550, a second electrode 600, and an encapsulation layer 700 may be provided in a dummy area DA on a substrate 100.

The sacrificial layer 450 provided in the dummy area DA, according to the fourth embodiment of the present disclosure, may be disposed in the dummy hole DH of the circuit element layer 200. In detail, the sacrificial layer 450 may be provided in the dummy hole DH on the substrate 100 along a profile of the dummy hole DH and may extend to an upper surface of the bank 400 on the substrate 100. Since the sacrificial layer 450 is provided along a profile of the dummy hole DH, the sacrificial layer 450 may be disposed closer to the light emitting layer 500 and a TFT provided in an active area AA, thereby effectively removing hydrogen and moisture capable of penetrating into the TFT and the light emitting layer 500. The sacrificial layer 450 may be provided up to the upper surface of the bank 400, but is not limited thereto.

The sacrificial layer 450 may be formed of a material which is large in reactivity with hydrogen and moisture, and for example, may be formed of one of Mg, Ca, and Ba or a compound including one of Mg, Ca, and Ba. Since the sacrificial layer 450 includes a material which is larger in reactivity with hydrogen and moisture than the light emitting layer 500, hydrogen and moisture may be blocked or removed so as not to affect the light emitting layer 500 and the TFT. The sacrificial layer 450 may be disposed in the dummy area DA surrounding the active area AA, thereby protecting TFTs disposed in an end of the active area AA.

The sacrificial layer 450 may be formed through a physical deposition process, a chemical deposition process, or a coating process, or may be patterned in each of a plurality of dummy pixels through a solution process using an inkjet apparatus without a mask.

As described above, in the electroluminescence display apparatus according to the fourth embodiment of the present disclosure, since the sacrificial layer 450 including a material which is large in reactivity with hydrogen and moisture is disposed in the dummy emission area, hydrogen and moisture may be blocked or removed so as not to affect the light emitting layer 500 and the TFT.

Therefore, in the electroluminescence display apparatus according to the fourth embodiment of the present disclosure, a hot spot occurring when hydrogen and moisture affect the TFT may be prevented, thereby solving a problem where image quality is degraded when the light emitting layer vulnerable to moisture is degraded.

As described above, in the electroluminescence display apparatus according to the embodiments of the present disclosure, since the sacrificial layer including a material which is large in reactivity with hydrogen and moisture is disposed in the dummy emission area, hydrogen and moisture may be blocked or removed so as not to affect the light emitting layer and the TFT.

Moreover, in the electroluminescence display apparatus according to the embodiments of the present disclosure, since the sacrificial layer is disposed in the dummy emission area, a hot spot occurring when hydrogen and moisture affect the TFT may be prevented, thereby solving a problem where image quality is degraded when the light emitting layer vulnerable to moisture is degraded.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescence display apparatus including an active area displaying an image and a dummy area adjacent to the active area not displaying an image, comprising:
   a substrate;
   a bank on the substrate to form an emission area in the active area and form a dummy emission area in the dummy area;
   a light emitting layer disposed in the emission area of the active area on the substrate;
   a dummy light emitting layer disposed in the dummy emission area of the dummy area on the substrate; and
   a sacrificial layer disposed under the dummy light emitting layer in the dummy emission area.

2. The electroluminescence display apparatus of claim 1, wherein the sacrificial layer includes a material having a greater reactivity with at least one of hydrogen or moisture than the dummy light emitting layer.

3. The electroluminescence display apparatus of claim 1, wherein the sacrificial layer comprises one of magnesium (Mg), calcium (Ca), and barium (Ba) or a compound including one of Mg, Ca, and Ba.

4. The electroluminescence display apparatus of claim 1, further comprising:
   a gate insulation layer disposed on the substrate;
   an interlayer insulation layer disposed on the gate insulation layer; and
   a planarization layer disposed on the interlayer insulation layer,
   wherein the light emitting layer and the dummy light emitting layer being on the planarization layer, wherein the sacrificial layer is disposed between the planarization layer and the dummy light emitting layer.

5. The electroluminescence display apparatus of claim 1, further comprising:
   a gate insulation layer disposed on the substrate;
   an interlayer insulation layer disposed on the gate insulation layer;
   a planarization layer disposed on the interlayer insulation layer; and
   a first electrode disposed on the planarization layer,
   wherein the light emitting layer and the dummy light emitting layer being on the planarization layer,
   wherein the sacrificial layer is disposed between the first electrode and the dummy light emitting layer.

6. The electroluminescence display apparatus of claim 1, further comprising:
  a gate insulation layer disposed on the substrate;
  an interlayer insulation layer disposed on the gate insulation layer;
  a planarization layer disposed on the interlayer insulation layer; and
  a dummy hole formed in the dummy emission area by partially removing the gate insulation layer, the interlayer insulation layer, and the planarization layer to expose the substrate, and
  the sacrificial layer is disposed in the dummy hole.

7. The electroluminescence display apparatus of claim 6, further comprising a first electrode disposed on the planarization layer in the active area to contact the light emitting layer,
  wherein the sacrificial layer filling the dummy hole from a top surface of the substrate is provided up to a height corresponding to a height of the first electrode from the substrate.

8. The electroluminescence display apparatus of claim 1, further comprising:
  a gate insulation layer disposed on the substrate;
  an interlayer insulation layer disposed on the gate insulation layer;
  a planarization layer disposed on the interlayer insulation layer; and
  a dummy hole formed by partially removing the gate insulation layer, the interlayer insulation layer, and the planarization layer being provided in the dummy emission area, the substrate being exposed by said partial removal,
  wherein
  the bank is disposed on the planarization layer,
  the sacrificial layer is provided in the dummy hole on the substrate along a profile of the dummy hole and extends to an upper surface of the bank, the profile overlying the substrate, the gate insulation layer, the interlayer insulation layer, the planarization layer and the bank.

9. An electroluminescence display apparatus including an active area displaying an image and a dummy area adjacent to the active area not displaying an image, comprising:
  a substrate;
  a bank on the substrate to form an emission area in the active area and form a dummy emission area in the dummy area;
  a light emitting layer disposed in the emission area of the active area overlying the substrate;
  a dummy light emitting layer disposed in the dummy emission area of the dummy area on the substrate; and
  a sacrificial layer disposed in the dummy emission area, the sacrificial layer including a material having a greater reactivity with at least one of hydrogen or moisture than the dummy light emitting layer.

10. The electroluminescence display apparatus of claim 9, wherein the sacrificial layer comprises one of magnesium (Mg), calcium (Ca), and barium (Ba) or a compound including one of Mg, Ca, and Ba.

11. The electroluminescence display apparatus of claim 9, further comprising:
  a planarization layer on the substrate; and
  a first electrode on the planarization layer,
  wherein the dummy light emitting layer is on planarization layer,
  wherein the sacrificial layer is disposed between the first electrode and the dummy light emitting layer.

12. The electroluminescence display apparatus of claim 9, further comprising:
  a thin film transistor provided only in the active area of the substrate.

13. The electroluminescence display apparatus of claim 12, further comprising:
  a dummy hole formed in the dummy area by partially removing the planarization layer to expose the substrate, and
  wherein the sacrificial layer is disposed in the dummy hole.

14. A display apparatus comprising:
  an active area including a plurality of pixels configured to display an image;
  a dummy area adjacent to the active area including a plurality of dummy pixels not configured to display an image;
  a substrate, the plurality of pixels of the active area and the plurality of dummy pixels in the dummy area overlying the substrate;
  a light emitting layer included in the plurality of pixels being disposed in the active area;
  a dummy light emitting layer included in the plurality of dummy pixels being disposed in the dummy area; and
  a sacrificial layer, the sacrificial layer overlying the dummy light emitting layer,
  wherein the active area and the dummy area are spaced from each other by a bank overlying the substrate.

15. The display apparatus of claim 14, wherein the sacrificial layer includes a material having a greater reactivity with at least one of hydrogen and moisture than the dummy light emitting layer, the material absorbing at least hydrogen and moisture to prevent the hydrogen and moisture penetrating the light emitting layer.

16. The display apparatus of claim 14, further comprising:
  a first electrode overlying the substrate, the first electrode formed on the active area and the dummy area,
  the sacrificial layer positioned between the first electrode and the dummy light emitting layer.

17. The display apparatus of claim 14, further comprising:
  an insulation layer overlying the substrate; and
  a dummy hole formed by partially removing the insulation layer in the dummy area, the partial removal in the dummy area exposing the substrate,
  wherein the sacrificial layer is deposited on the dummy hole to overlay the substrate and the insulation layer; and
  the dummy light emitting layer is disposed on the sacrificial layer.

18. The display apparatus of claim 14, further comprising:
  an insulation layer overlying the substrate; and
  a dummy hole formed by partially removing the insulation layer in the dummy area, the partial removal in the dummy area exposing the substrate and a side surface of the insulation layer,
  the sacrificial layer disposed along the substrate, the side surface of the insulation layer of the dummy hole, wherein the sacrificial layer further extends along a side surface and a top surface of the bank.

19. The display apparatus of claim 18, wherein the dummy light emitting layer being partially disposed on the sacrificial layer.

20. The display apparatus of claim 19, wherein the dummy light emitting layer positioned to not overly the side surface of the insulation layer and the side surface and the top surface of the bank.

* * * * *